(12) United States Patent
Bar-Sadeh et al.

(10) Patent No.: US 7,787,352 B2
(45) Date of Patent: Aug. 31, 2010

(54) METHOD FOR PROCESSING A MEMS/CMOS CANTILEVER BASED MEMORY STORAGE DEVICE

(75) Inventors: Eyal Bar-Sadeh, Jerusalem (IL); Tsung-Kuan Chou, San Jose, CA (US); Valluri Rao, Saratoga, CA (US); Krishnamurthy Murali, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 12/005,894

(22) Filed: Dec. 28, 2007

(65) Prior Publication Data

US 2008/0105937 A1     May 8, 2008

Related U.S. Application Data

(62) Division of application No. 11/168,195, filed on Jun. 28, 2005, now Pat. No. 7,354,788.

(51) Int. Cl.
    G11B 9/00     (2006.01)
(52) U.S. Cl. .................................................. 369/140
(58) Field of Classification Search ................. 369/15, 369/140
    See application file for complete search history.

(56) References Cited

U.S. PATENT DOCUMENTS 5,546,375 A    8/1996   Shimada et al.
5,970,315 A   10/1999   Carley et al.
7,354,788 B2 * 4/2008   Bar-Sadeh et al. ............ 438/52
2004/0150472 A1 8/2004  Rust

OTHER PUBLICATIONS

E. Eleftheriou et al., "Millipede—A MEMS-Based Scanning-Probe Data-Storage System", IEEE Transaction on Magnetics, vol. 39, No. 2, Mar. 2003.
H. Pozidis et al., "Scanning Probes Entering Data Storage: From Promise to Reality", IBM Research Division Zurich Research Laboratory, 2006 IEEE.
H. Hamann et al., "Ultra-High-Density Phase-Change Storage and Memory", Nature Materials, vol. 5, May 2006, Published online: Apr. 9, 2006.
L. Richard Carley et al., "MEMS-Based Integrated-Circuit Mass-Storage Systems", Communications of the ACM Nov. 2000/vol. 43, No. 11.
Roland Guerre et al., "Selective Transfer Technology for Microdevice Distribution", Journal of Microelectromechanical Systems, vol. 17, No. 1, Feb. 2008.
P. Vettiger et al., "The "Millipede"—More than one thousand tips for future AFM data storage", IBM J. Res. Develop. vol. 44 No. 3 May 2000.

* cited by examiner

*Primary Examiner*—Evan Pert
(74) *Attorney, Agent, or Firm*—Philip A. Pedigo

(57) ABSTRACT

A Seek and Scan Probe (SSP) memory device is disclosed. The memory device includes a moving part having micro-electromechanical (MEMS) structures fabricated on a first wafer and CMOS and memory medium components fabricating on a second wafer bonded to the first wafer.

5 Claims, 8 Drawing Sheets

METHOD FOR PROCESSING A MEMS/CMOS CANTILEVER BASED MEMORY STORAGE DEVICE

PRIORITY

This application is a divisional application of application Ser. No. 11/168,195, filed Jun. 28, 2005, now U.S. Pat. No. 7,354,788, which is assigned to the assignee of the present application.

FIELD OF THE INVENTION

The present invention relates generally to memory device, more specifically, the present invention relates to processing a Seek and Scan Probe memory device.

BACKGROUND

Currently, there is a drive to implement Seek and Scan Probe (SSP) memory devices for memory applications. SSP devices include a top wafer made from silicon on insulator (SOI) that includes microelectromechanical (MEMS) cantilever beams mounted on a CMOS substrate. A cantilever beam accesses transistor storage devices on a bottom CMOS wafer. To access the storage devices the cantilever beams are constructed to move along the X-Y axis of the lower wafer.

A problem exists with SSP memory devices in that the process of manufacturing the top wafer is expensive. This is because MEMS and CMOS are processed on the wafer. Such a process exhibits low process yields.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A low cost silicon process flow to manufacture a Seek and Scan Probe (SSP) memory device is described. The SSP memory device includes an array of cantilever probe tips that write on a phase change memory medium. In one embodiment, the probe tips and positioning stage are fabricated on one wafer, while CMOS electronics and the phase change memory medium on top is fabricated on a second wafer. The two wafers are then bonded together and subsequently the probe wafer is ground back to release the moving platforms.

In one embodiment, existing CMOS process flow is utilized. In a further embodiment, the cantilevers are built with polysilicon, nitride and a top conducting metallic layer which (e.g., gold) on standard silicon wafers. According to one embodiment, a combination of ECR (Electron Cyclotron Resonance) silicon etching is used, followed by wafer backgrind to release moving X-Y stages. In yet another embodiment, MEMS structures are on one wafer, while the CMOS and memory medium are on the second wafer.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
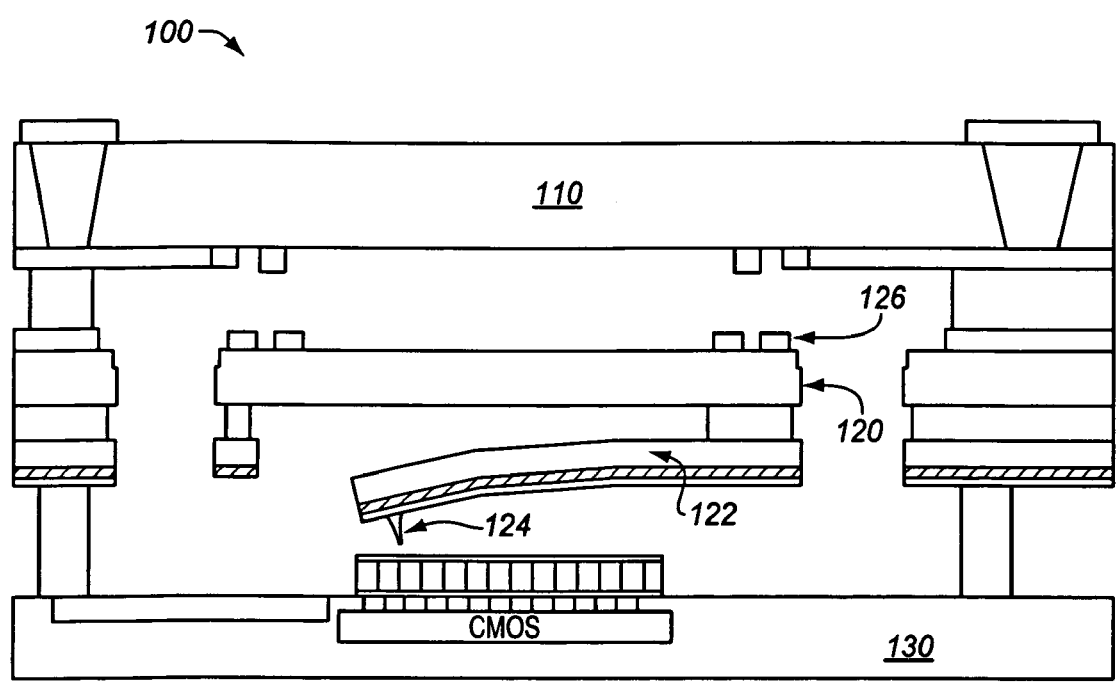
FIG. 1 illustrates one embodiment of a Seek and Scan Probe (SSP) memory device.

FIG. 1 illustrates a cross-section of one embodiment of a SSP memory device 100. Device 100 includes a cover wafer 110, a MEMS moving part 120 and a CMOS wafer 130. Cover wafer 110 encapsulates MEMS moving part 120. Cover wafer 110 includes through vias to route I/O and power to/from MEMS moving part 120. In addition, metal lines are included to serve as stator for a Vernier drive.

MEMS moving part 120 includes set of polysilicon cantilever beams 122 with sharp tips 124. According to one embodiment, MEMS moving part 120 is held by springs to facilitate movement in the X-Y directions. Vernier driver metal fingers 126 are located at the other side of the MEMS wafer. CMOS wafer 130 is the electronic wafer that includes control circuits and CMOS transistors for memory storage. When accessing a storage device at CMOS wafer 130, a tip 124 of a cantilever 122 contacts the device, making an electrical connection.

Figure 2:
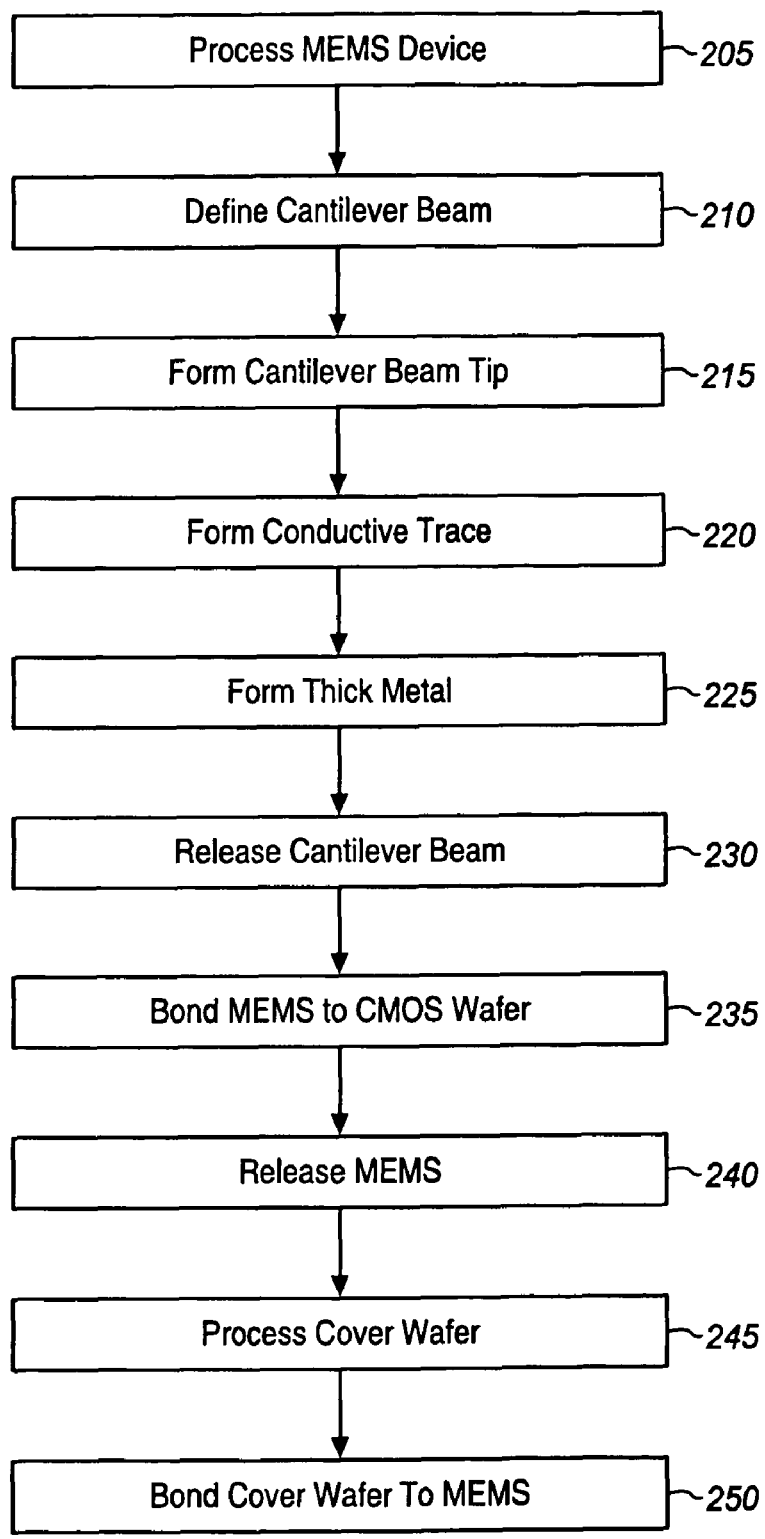
FIG. 2 is a flow diagram illustrating one embodiment of processing a SSP memory device.

FIG. 2 is a flow diagram illustrating one embodiment of processing SSP memory device 100. At processing block 205, processing of MEMS moving part 120 is initiated. The process includes depositing oxide (e.g., thermal oxide or CVD SiO2) of approximately 2 um on a silicon wafer via sacrificial oxide deposition.

Figure 3:
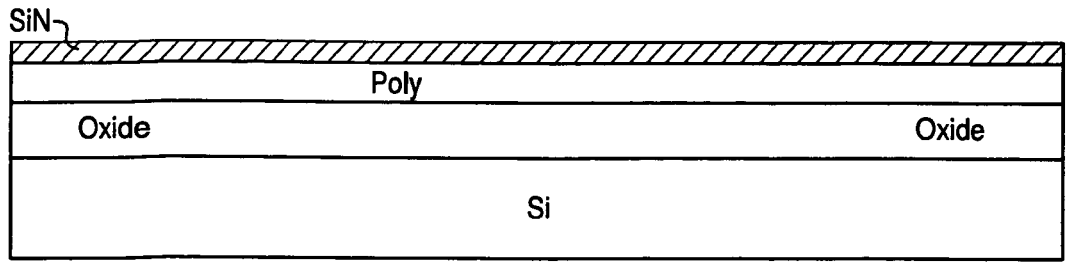
FIG. 3 illustrates one embodiment of a process flow for a SSP memory device.

Next, a first polysilicon layer (approximately 5000 A) is deposited over the oxide layer. In one embodiment, an optional implant into the polysilicon layer may be conducted for conductivity and stress control. Finally, Low Pressure Chemical Vapor Deposition (LPCVD) of silicon nitride is layered over the polysilicon. The silicon nitride layer is implemented for stress control to tune the cantilevers for bending at a predetermined angle. FIG. 3 illustrates one embodiment of the process flow for the device 100 after LPCVD.

Figure 4:
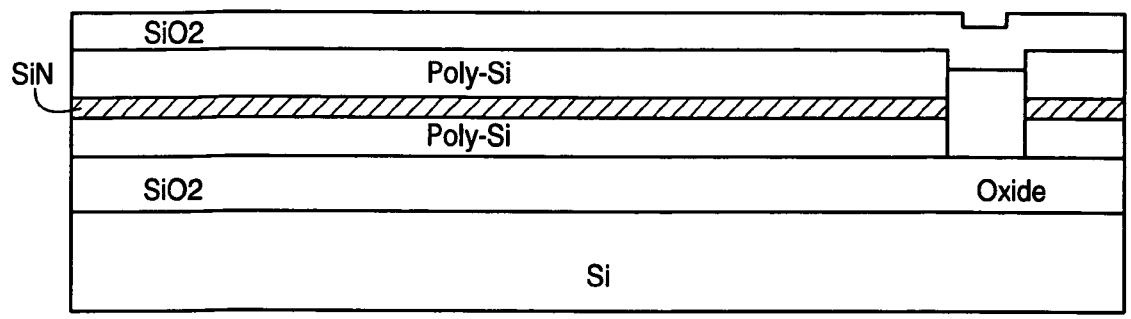
FIG. 4 illustrates another embodiment of a process flow for a SSP memory device.

Referring back to FIG. 2, the cantilever beams are defined at processing block 210. This process includes applying a lithography mask over the silicon nitride layer. Subsequently, the silicon nitride and polysilicon layers are etched via reactive ion etching (RIE). Next, a second thin layer of oxide is deposited via Chemical Vapor Deposition (CVD). A second polysilicon layer is then deposited. This layer is used to form the tip of the cantilevers. Finally, an oxide mask is deposited over the second polysilicon layer via CVD. FIG. 4 illustrates one embodiment of the process flow for the device 100 after CVD of the oxide mask.

Figure 5:
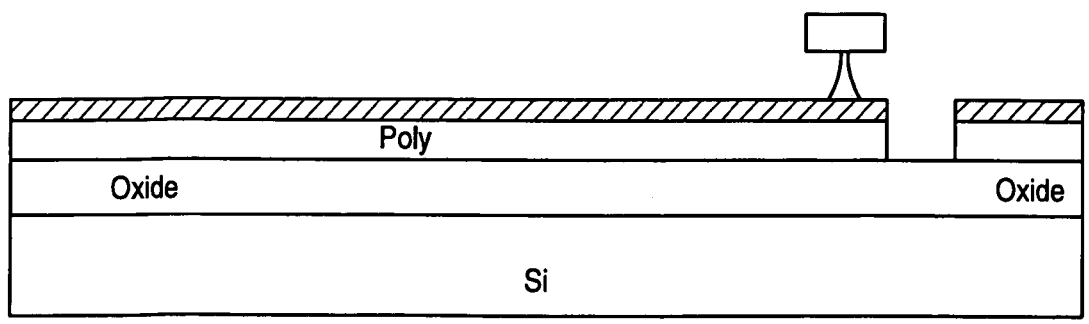
FIG. 5 illustrates yet another embodiment of a process flow for a SSP memory device.

Referring back to FIG. 2, the tip of the cantilever beams are formed at processing block 215. First, a second lithography mask is deposited over the oxide mask. The polysilicon layer is subsequently etched via a hard mask etch (e.g., RIE or hydrogen fluoride (HF) based wet etch). This process forms a sharp polysilicon tip under the oxide. Next, a poly anisotropic etch is performed, followed by a sharpening oxidation. FIG. 5 illustrates one embodiment of the process flow for the device 100 after sharpening oxidation.

Figure 6:
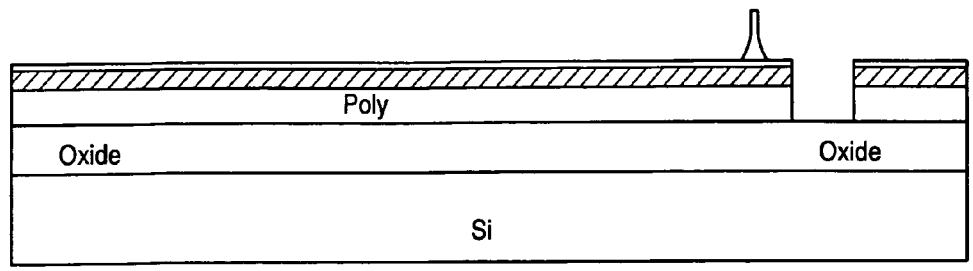
FIG. 6 illustrates still another embodiment of a process flow for a SSP memory device.

Referring back to FIG. 2, metal is deposited and patterned to form a conductive trace at processing block 220. This process begins with an etch of the oxide mask layer. Next, a thin metal layer is deposited over the polysilicon layer. A metal lithography process is performed, followed by a metal etch. FIG. 6 illustrates one embodiment of the process flow for the device 100 after the metal etch is performed.

Figure 7:
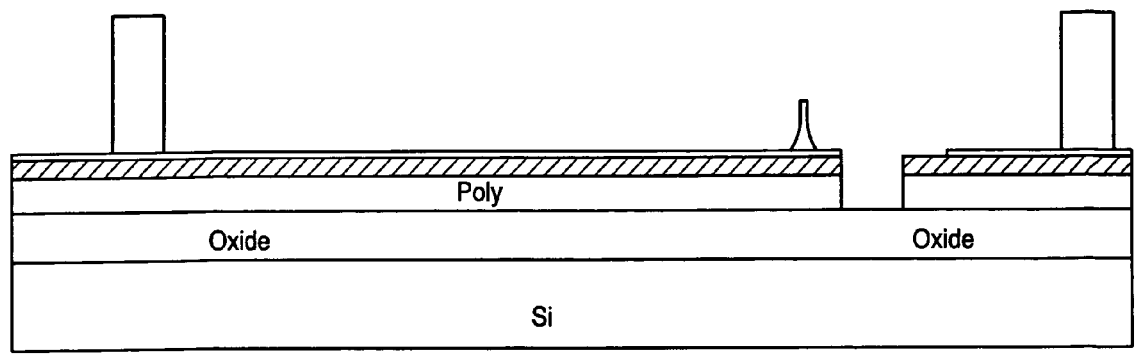
FIG. 7 illustrates another embodiment of a process flow for a SSP memory device.

Referring back to FIG. 2, thick metal is formed on the thin metal layer at specific locations, processing block 225. To form the thick metal, a resist coating and pattern process is performed. A metal seed sputter is then performed, followed by a mold resist coat. Next, a metal e-plating process is completed. Finally, the mold is removed, the seed is etched and the resist coat is stripped. FIG. 7 illustrates one embodiment of the process flow for the device 100 after the thick metal posts are formed.

Figure 8:
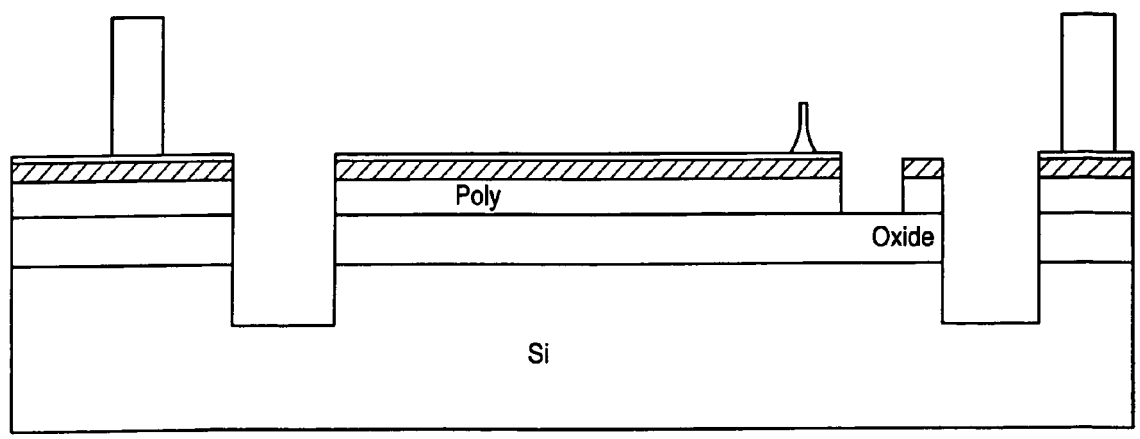
FIG. 8 illustrates another embodiment of a process flow for a SSP memory device.

Referring back to FIG. 2, the cantilevers are released, processing block 230. First, trenches are formed to initiate the release of the cantilevers, this process involves performing an etch (e.g., dry etch) of portions of the silicon nitride layer adjacent to the thick metal posts to form trenches. Subsequently, the exposed portion of the polysilicon layer is dry etched. The exposed oxide layer is then dry etched, followed by a dry etch of the silicon layer. According to one embodiment, the silicon layer is etched to a depth of 50 µm. FIG. 8 illustrates one embodiment of the process flow for the device 100 after the trenches adjacent to the cantilever have been formed.

Figure 9:
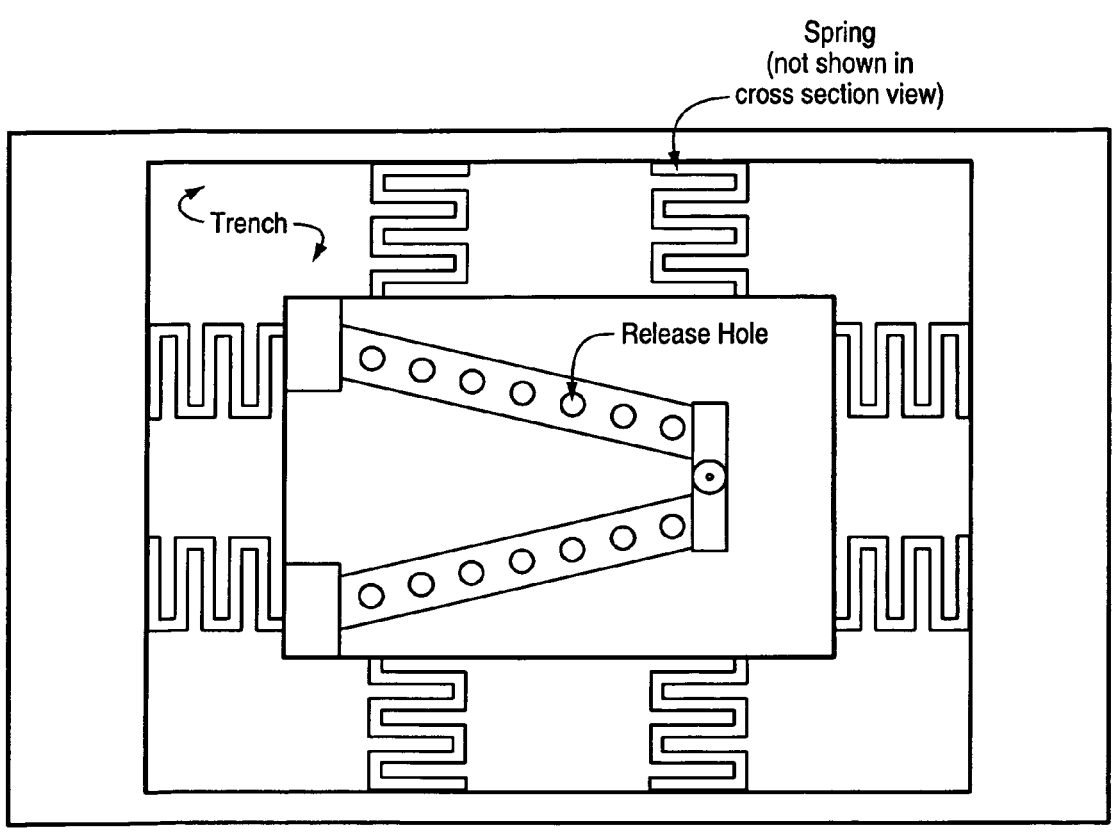
FIG. 9 illustrates a top view of one embodiment a process flow for a SSP memory device.

FIG. 9 illustrates a top view of one embodiment of device 100 after completion of the process shown in FIG. 8. As shown in FIG. 9, springs are included on each side of the cantilever beam. The springs are used to later attach moving part 120 to other components of device 100 to facilitate movement of device 100 in the X-Y directions.

Figure 10:
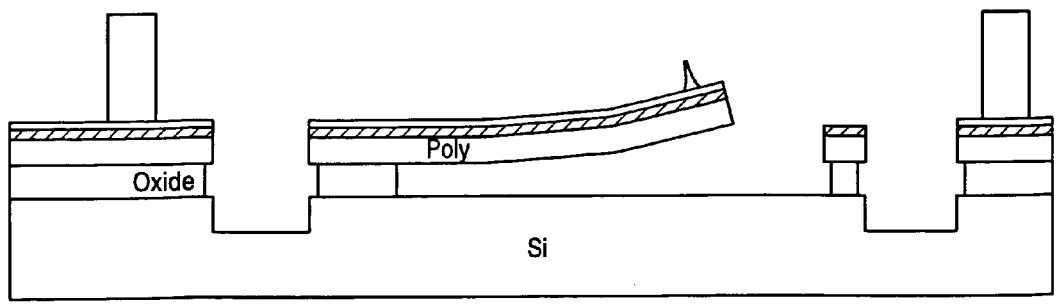
FIG. 10 illustrates one embodiment of a process flow for a SSP memory device.

Referring back to FIG. 2, the oxide layer underneath the polysilicon layer in the cantilever is control etched in order to release the cantilever. FIG. 10 illustrates one embodiment of the process flow for the device 100 after the cantilever has been released. As shown in FIG. 10, the cantilever currently is supported by a small portion of oxide opposite of the tip.

Figure 11:
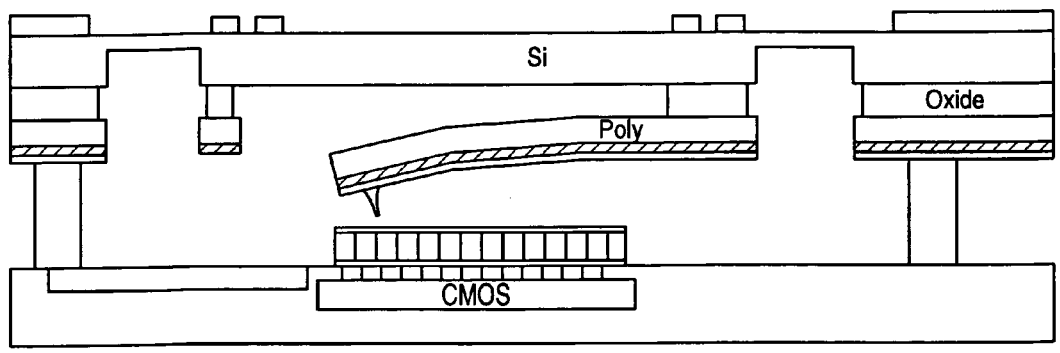
FIG. 11 illustrates another embodiment of a process flow for a SSP memory device.

Referring back to FIG. 2, the MEMS wafer is flipped and bonded to CMOS wafer 130 at the thick metal posts, processing block 235. Subsequently, the MEMS wafer undergoes a grinding process. Afterwards, metal is sputtered on the silicon layer of the MEMS, and metal lithography and etching is performed. The metal sputter, lithography and etching processes forms the Vernier driver metal fingers used to route I/O. FIG. 11 illustrates one embodiment of the process flow for the device 100 after the MEMS wafer is bonded to the CMOS wafer, and the metal fingers are formed.

Figure 12:
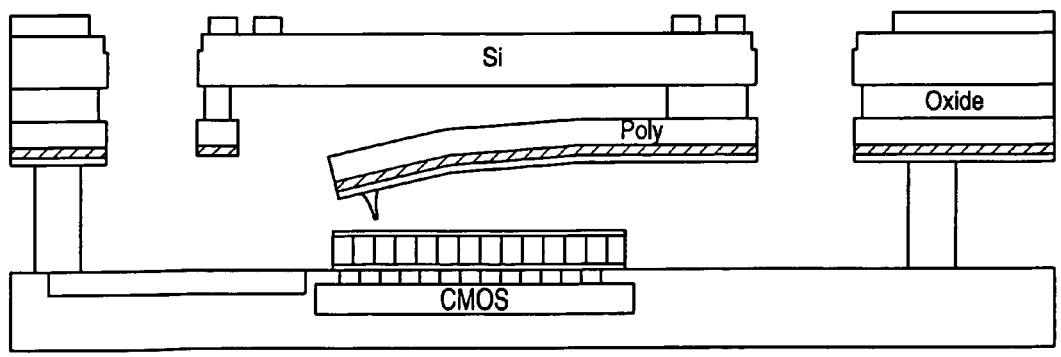
FIG. 12 illustrates yet another embodiment of a process flow for a SSP memory device.
Figure 13:
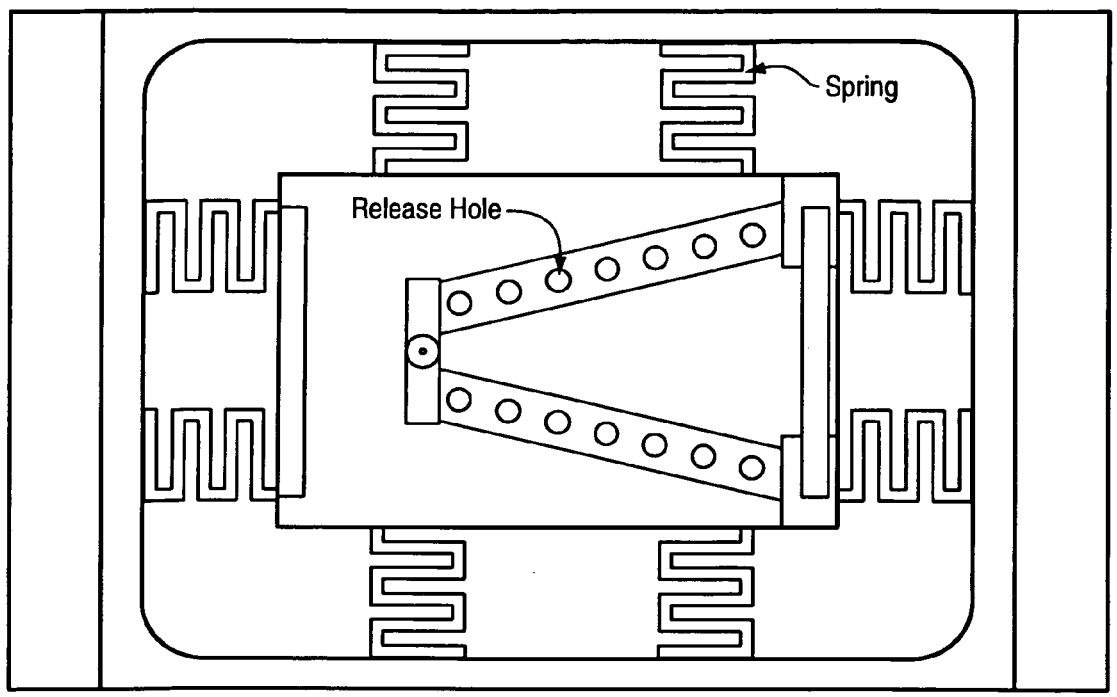
FIG. 13 illustrates a top view of one embodiment a process flow for a SSP memory device.

Referring back to FIG. 2, the MEMS wafer is released to form the moving part 120 at processing block 240. According to one embodiment, this process is implemented via silicon dry etching. FIG. 12 illustrates one embodiment of the process flow for the device 100 after the MEMS wafer has been released. At this stage the moving part 120 is held by the springs (not shown) that enable movement at the lateral direction. Note that the springs are rigid in the vertical direction. FIG. 13 illustrates a top view of one embodiment of device 100 after completion of the process shown in FIG. 12. As shown in FIG. 13, the springs couple moving part 120 to the side structure of the MEMS wafer.

Referring back to FIG. 2, cover wafer 110 is processed, processing block 245. To process cover wafer 110, silicon nitride is deposited over a silicon wafer. Gold is then sputtered over the silicon nitride, followed by gold lithography and etching. Next, a resist spin and pattern is performed to generate bonding studs. Subsequently, a seed sputter is performed. Gold plating is then performed followed by mold resist strip and seed etching.

Figure 14:
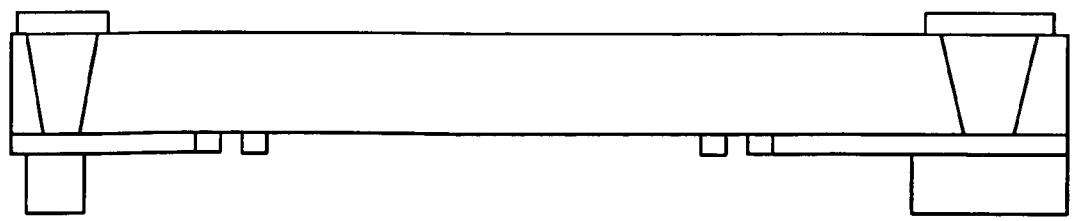
FIG. 14 illustrates one embodiment of a process flow for a cover wafer.

The cover wafer is subsequently flipped upside down. The wafer then undergoes via lithography and a nitride etch. Next, potassium hydroxide silicon etching is performed. Finally, a metal sputter is deposited, followed by metal lithography and etching. FIG. 14 illustrates one embodiment of the cover wafer 110 after it has been formed.

Referring back to FIG. 2, cover wafer 110 is bonded to the MEMS wafer, processing block 250. Subsequent to the bonding, memory device 100 has been completed, as shown in FIG. 1 above.

Figure 15:
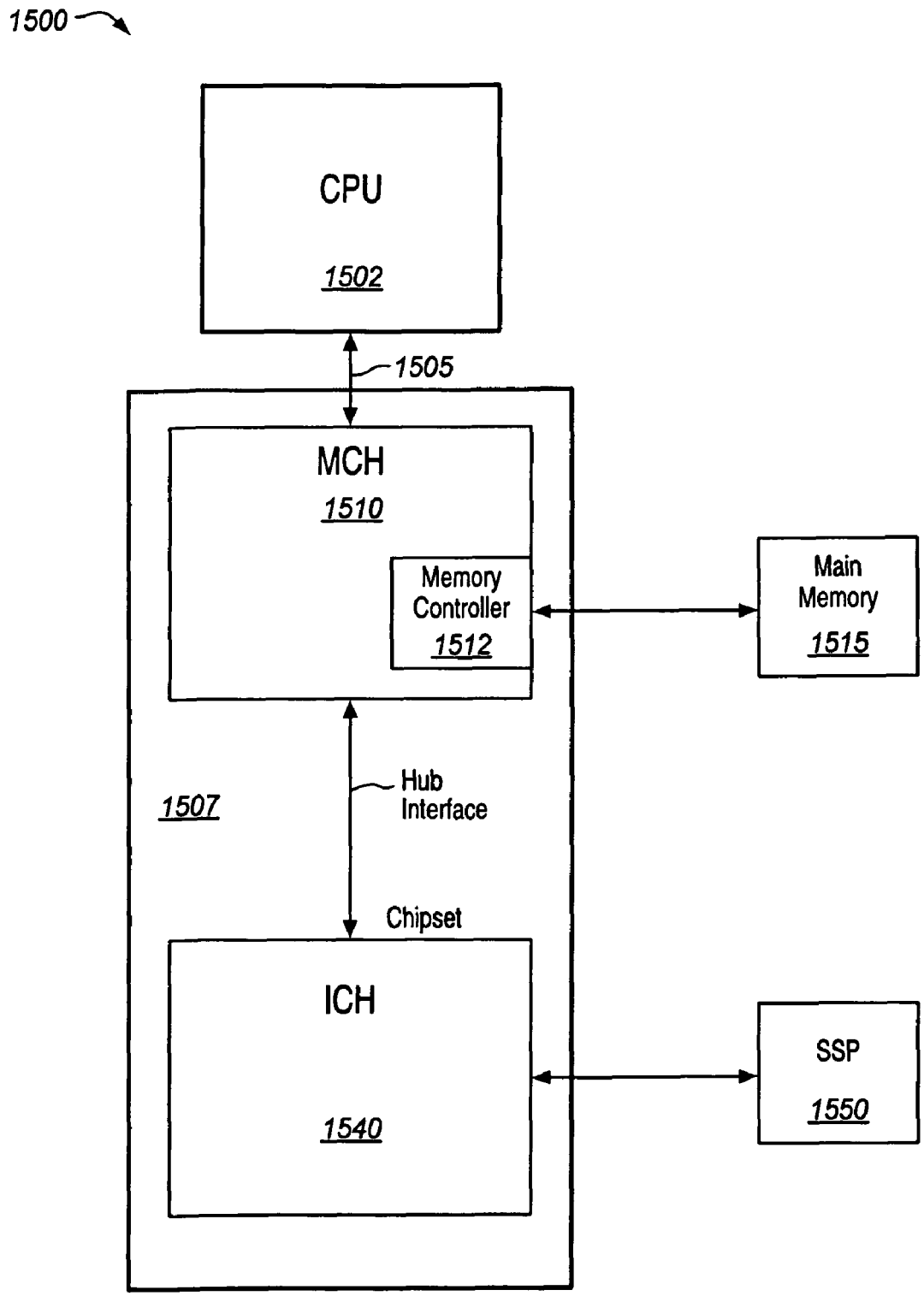
FIG. 15 illustrates one embodiment of a computer system.

FIG. 15 illustrates one embodiment of a computer system 1500 in which memory device 100 may be implemented. Computer system 1500 includes a central processing unit (CPU) 1502 coupled to an interface 1505. In one embodiment, CPU 1502 is a processor in the Pentium® family of processors Pentium® IV processors available from Intel Corporation of Santa Clara, Calif. Alternatively, other CPUs may be used.

In a further embodiment, a chipset 1507 is also coupled to interface 1505. Chipset 1507 includes a memory control hub (MCH) 1510. MCH 1510 may include a memory controller 1512 that is coupled to a main system memory 1515. Main system memory 115 stores data and sequences of instructions that are executed by CPU 102 or any other device included in system 100. In one embodiment, main system memory 1515 includes dynamic random access memory (DRAM); however, main system memory 1515 may be implemented using other memory types (e.g., an SSP memory device). Additional devices may also be coupled to interface 1505, such as multiple CPUs and/or multiple system memories.

MCH 1510 is coupled to an input/output control hub (ICH) 1540. ICH 1540 provides an interface to input/output (I/O) devices within computer system 1500. According to one embodiment, a SSP memory device 1550 is coupled to ICH 1540.

The above-described process for manufacturing a SSP memory device feature cantilever beams built with polysilicon, nitride and a top conducting metallic layer (e.g., gold) on standard silicon wafers as opposed to doped single crystal cantilevers made from SOI wafers.

Further, a combination of ECR (Electron Cyclotron Resonance) silicon etching is used, followed by wafer backgrind to release moving X-Y stages in order to avoid the expensive and time consuming process of deep RIE etching process commonly used to release such high aspect ratio structures. Another feature is that all MEMS structures are on one wafer, while the CMOS and memory medium are on a second wafer. This eliminates a mix and match of MEMS and CMOS processing, greatly improving yield and reduces overall cost.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A probe based memory device comprising:
   one or more microelectromechanical (MEMS) structures fabricated on a first wafer; and
   complementary metal-oxide-semiconductor (CMOS) circuitry and a memory medium fabricated on a second wafer, wherein the first wafer is bonded to the second wafer.

2. The probe based memory device of claim 1, wherein the one or more MEMS structures comprises an array of cantilever probes to read data from and write data to the memory medium.

3. The probe based memory device of claim 2, wherein each of the cantilever probes includes a sharp probe tip.

4. The probe based memory device of claim 2, wherein the array of cantilever probes is coupled with a spring to facilitate movement.

5. The probe based memory device of claim 1, wherein the cantilever probes are, at least partly, fabricated using surface micromachining.

* * * * *